United States Patent
Killian et al.

(10) Patent No.: US 11,665,846 B2
(45) Date of Patent: *May 30, 2023

(54) DISTRIBUTED MODULAR INPUT/OUTPUT (I/O) SYSTEM WITH REDUNDANT ETHERNET BACKPLANE NETWORKS FOR IMPROVED FAULT TOLERANCE

(71) Applicant: Rockwell Automation Technologies, Inc., Mayfield Heights, OH (US)

(72) Inventors: Daniel E. Killian, Eastlake, OH (US); Sivaram Balasubramanian, Solon, OH (US); Kendal R. Harris, Mentor, OH (US); Chandresh R. Chaudhari, Reminderville, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/496,072

(22) Filed: Oct. 7, 2021

(65) Prior Publication Data

US 2022/0030733 A1     Jan. 27, 2022

Related U.S. Application Data

(63) Continuation of application No. 16/584,194, filed on Sep. 26, 2019, now Pat. No. 11,147,181.

(51) Int. Cl.
    *G06F 13/40*       (2006.01)
    *H05K 7/14*        (2006.01)
    *G05B 19/418*     (2006.01)

(52) U.S. Cl.
CPC ....... *H05K 7/1477* (2013.01); *G05B 19/4186* (2013.01); *G06F 13/4027* (2013.01); *G05B 2219/31368* (2013.01); *H05K 7/1482* (2013.01)

(58) Field of Classification Search
None
See application file for complete search history.

(56) References Cited

U.S. PATENT DOCUMENTS

| | | |
|---|---|---|
| 6,549,034 B1 | 4/2003 | Pietrzyk et al. |
| 6,909,923 B2 | 6/2005 | Vasko et al. |

(Continued)

FOREIGN PATENT DOCUMENTS

| | | | |
|---|---|---|---|
| EP | 3 051 370 A1 | 8/2016 | |
| EP | 3 076 250 A1 | 10/2016 | |
| WO | WO 2016/151019 A1 | 9/2016 | |

OTHER PUBLICATIONS

Extended European Search Report dated Jan. 28, 2021 for Application No. EP 20189501.8.

(Continued)

*Primary Examiner* — Scott C Sun
(74) *Attorney, Agent, or Firm* — Lippes Mathias LLP

(57) ABSTRACT

A modular I/O system for an industrial automation network includes a network adapter including first and second adapter modules, wherein each adapter module is configured for connection with an industrial network. The I/O system further includes a first I/O device with first and second I/O modules each configured for operative connection to a controlled system for input/output of data with respect to the controlled system. The I/O system further includes first and second independent backplane data networks that connect each of the first and second adapter modules to each of the first and second I/O modules. The network adapter includes first and second removable backplane network switches and the first I/O device includes third and fourth removable backplane network switches that establish the backplane networks. The backplane network switches can be Ethernet gigabit switches.

10 Claims, 4 Drawing Sheets

(56) References Cited

U.S. PATENT DOCUMENTS

| | | | |
|---|---|---|---|
| 7,206,877 B1 * | 4/2007 | Doerenberg | H04L 67/12 |
| | | | 710/110 |
| 7,596,635 B2 | 9/2009 | Siorek et al. | |
| 7,602,617 B2 | 10/2009 | Brandt et al. | |
| 8,149,554 B2 | 4/2012 | Pietrzyk et al. | |
| 8,184,417 B2 | 5/2012 | Pietrzyk et al. | |
| 8,441,766 B2 | 5/2013 | Pietrzyk et al. | |
| 8,769,158 B2 | 7/2014 | Kretschmann et al. | |
| 10,186,821 B2 | 1/2019 | Müller et al. | |
| 10,631,426 B1 | 4/2020 | Lostoski et al. | |
| 2003/0154431 A1 | 8/2003 | Lin et al. | |
| 2007/0016701 A1 | 1/2007 | Siorek et al. | |
| 2014/0226460 A1 | 8/2014 | Kretschmann et al. | |
| 2020/0314025 A1 * | 10/2020 | DiFerdinando | H04L 45/745 |

OTHER PUBLICATIONS

European Examination Report dated Dec. 1, 2022 for EP Application No. EP 20189501.8 (6 pages).

* cited by examiner

DISTRIBUTED MODULAR INPUT/OUTPUT (I/O) SYSTEM WITH REDUNDANT ETHERNET BACKPLANE NETWORKS FOR IMPROVED FAULT TOLERANCE

CROSS REFERENCE TO RELATED APPLICATION

This application is a continuation of U.S. application Ser. No. 16/584,194 filed Sep. 26, 2019 (Sep. 26, 2019), now assigned U.S. Pat. No. 11,147,181, and the entire disclosure of said prior application is hereby expressly incorporated by reference into the present specification.

FIELD

The present development relates to industrial automation control systems and, more particularly, to a distributed modular input/output (I/O) system that provides enhanced fault tolerance as required for certain applications such as a distributed control system (DCS) for process control or for other applications requiring high availability, i.e., a high MTTF (mean time to failure) combined with a low MTTR (mean time to repair).

BACKGROUND INFORMATION

Distributed modular input/output (I/O) systems for industrial automation control systems are well-known and in widespread use. Referring to FIG. 1, a known distributed modular I/O system 10 includes a network adapter 12 that is operatively connected to an industrial automation network N such as an Ethernet/IP network or other industrial automation network so that the network adapter 12 receives data from, transmits data to, and otherwise communicates with an industrial control module or "controller" C also connected to the network N. The controller C comprises one or more programmable logic controllers (PLC), microprocessors, and/or other electronic processors programmed and configured for controlling an industrial machine, process, or other controlled system CS.

The adapter 12 includes an adapter base 12a that is mounted to a DIN rail D or other support structure, and an adapter module 12b is permanently or releasably connected to the adapter base 12a. The adapter module 12b includes the electronic circuitry for data communication with the controller C via network N and for data communication with multiple I/O devices 20 of the system 10 as described below. The adapter 12 comprises one or more network connectors NC for connecting with the network N via known connectors such as RJ45 connectors, Small FormFactor Pluggable (SFP) connectors, or the like. The adapter 12 typically also includes a power input connector PC for connecting with a source of electrical power for supplying electrical power to the adapter module 12 and to the I/O devices 20 and other components operatively connected to the adapter 12 and/or I/O devices 20.

The I/O devices 20 each include an I/O base 20a also mounted to the DIN rail D or other support structure, with a first I/O base 20a located adjacent and operably physically and electrically connected to the adapter base 12a by a multi-contact electrical connector K and with the additional I/O bases 20a operably physically and electrically connected together one after the other in a sequential manner by successive mating multi-contact electrical connectors K such that a modular backplane circuit or backplane network (generally "backplane" and illustrated as a broken line 14) is constructed and adapted for communicating electrical power and data through the successively connected I/O bases 20a and operably connects each I/O base 20a to the network adapter 12 and, thus, to the controller C. In addition to the I/O base 20a, each I/O device 20 further comprises an I/O module 20b operatively removably connected to the I/O base 20a such that the installed I/O module 20b also communicates with the network adapter 12 and the controller C over the backplane 14 whereby input/output data are provided between the controller C and each I/O module 20b via backplane 14. Each installed I/O module 20b is selected and configured to perform one or more specialized input/output functions such as DC input, DC output, AC input, AC output, analog input and/or output, RTD and/or thermocouple input and/or output, or the like as is generally known in the field of industrial automation.

Each I/O base 20a further includes a terminal block 20c comprising a plurality of cage clamps, spring clamps, screw terminals, or other wiring connectors 20d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the controlled system CS) by the controller C. The terminal block 20c can be a separate structure that is assembled to the I/O base 20a or can alternatively be defined as an integral or one-piece part of the I/O base 20a. Different varieties of terminal blocks 20a can be used depending upon the particular configuration required for the field device wiring connectors 20d, with some having different common terminals, ground connections, voltage supply terminals, and the like. Each installed I/O module 20b communicates with the field device wiring connectors 20d of the same I/O base 20a to which the I/O module 20b is physically connected. Input/output data are provided between the controller C and field device(s) FD connected to the corresponding I/O base 20a via backplane 14 and the network adapter module 12b.

FIG. 2A is a schematic representation of the distributed modular input/output (I/O) system 10 of FIG. 1. It can be seen that the backplane 14 includes only a single (non-redundant) circuit 14a that sequentially connects the network adapter 12 and the successively adjacent I/O devices 20 in a series or a sequential "daisy-chain" manner through the mated connectors K. In particular, the adapter 12 and each I/O device 20 include backplane circuitry that is located in the respective base 12a,20a and/or that is located in the adapter or I/O module 12b,20b connected to the respective base and that establishes the above-described backplane circuit 14 using a known backplane data communication protocol such as an open end-to-end protocol for control using or based upon Common Industrial Protocol (CIP) or another suitable backplane protocol.

FIG. 2B is similar but shows another known system 10' wherein the network adapter 12' includes first and second redundant adapter modules 12b1,12b2 connected to the base 12a' and wherein each I/O device 20' includes first and second redundant I/O modules 20b1,20b2 connected to the respective base 20a'. In the case of FIG. 2B, fault tolerance is improved because a failed adapter module 12b1,12b2 or a failed I/O module 20b1,20b2 can be replaced without interrupting operation of the modular I/O system 10'. Like the system 10 of FIG. 2A, however, the backplane 14 includes only a single (non-redundant) circuit 14a that sequentially connects the network adapter 12 and the successively adjacent I/O devices 20 in a series or "daisy-chain"

manner such that the backplane circuit 14 is interrupted by only a single point of failure.

Those of ordinary skill in the art will recognize that the backplane 14 of FIGS. 2A and 2B does not provide a truly fault tolerant system in that the backplane 14 includes only a single data path that is not redundant. Thus, if any component of the backplane circuit 14a fails, the backplane 14 is interrupted at least for some of the I/O devices 20 connected to the backplane 14. This single-point backplane failure outcome is undesirable in many industrial automation control applications, such as distributed control systems for process and plant control where continuous and uninterrupted operation of the controlled process or system is required.

SUMMARY

In accordance with one aspect of the present development, a modular I/O system for an industrial automation network includes a network adapter including first and second adapter modules, wherein each adapter module is configured for operatively connection with an associated industrial network. The I/O system further includes a first I/O device located adjacent to the network adapter. The first I/O device includes first and second I/O modules each configured for operative connection to an associated controlled system for input and output of data with respect to the associated controlled system. The I/O system further includes first and second independent backplane data circuits or networks that operably connect each of the first and second adapter modules to each of the first and second I/O modules.

In accordance with a further aspect of the present development, the network adapter includes first and second removable network switches and the first I/O device includes third and fourth removable network switches. The first and second network switches are each connected to both of the first and second adapter modules of the network adapter. The third and fourth network switches are each connected to both the first and second I/O modules. The first and third network switches are connected to each other on the first backplane network and the second and fourth network switches are connected to each other on the second backplane network.

DETAILED DESCRIPTION

Figure 1:
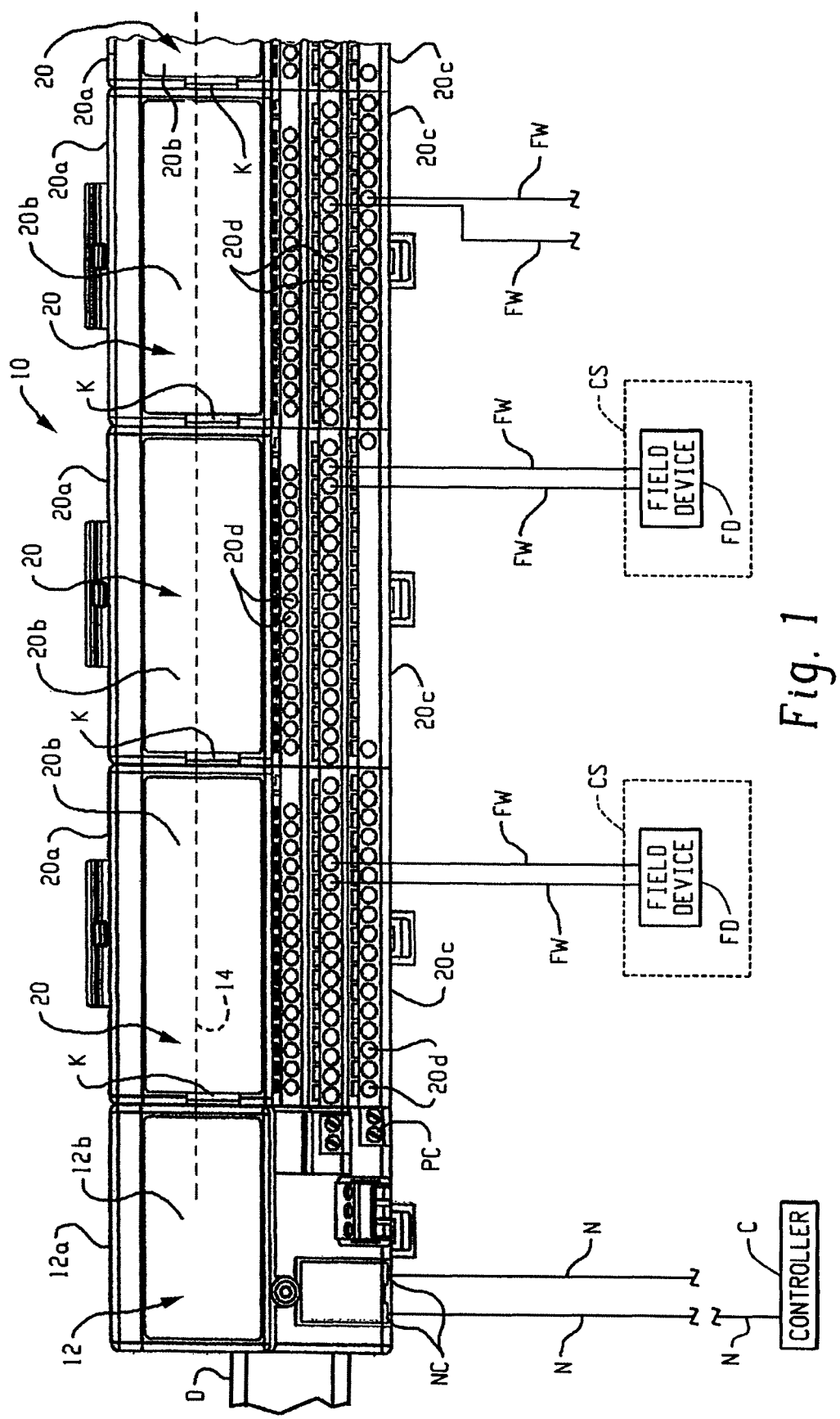
FIG. 1 shows an example of an industrial control system including an industrial automation controller and a known distributed modular input/output (I/O) system.
Figure 2A:
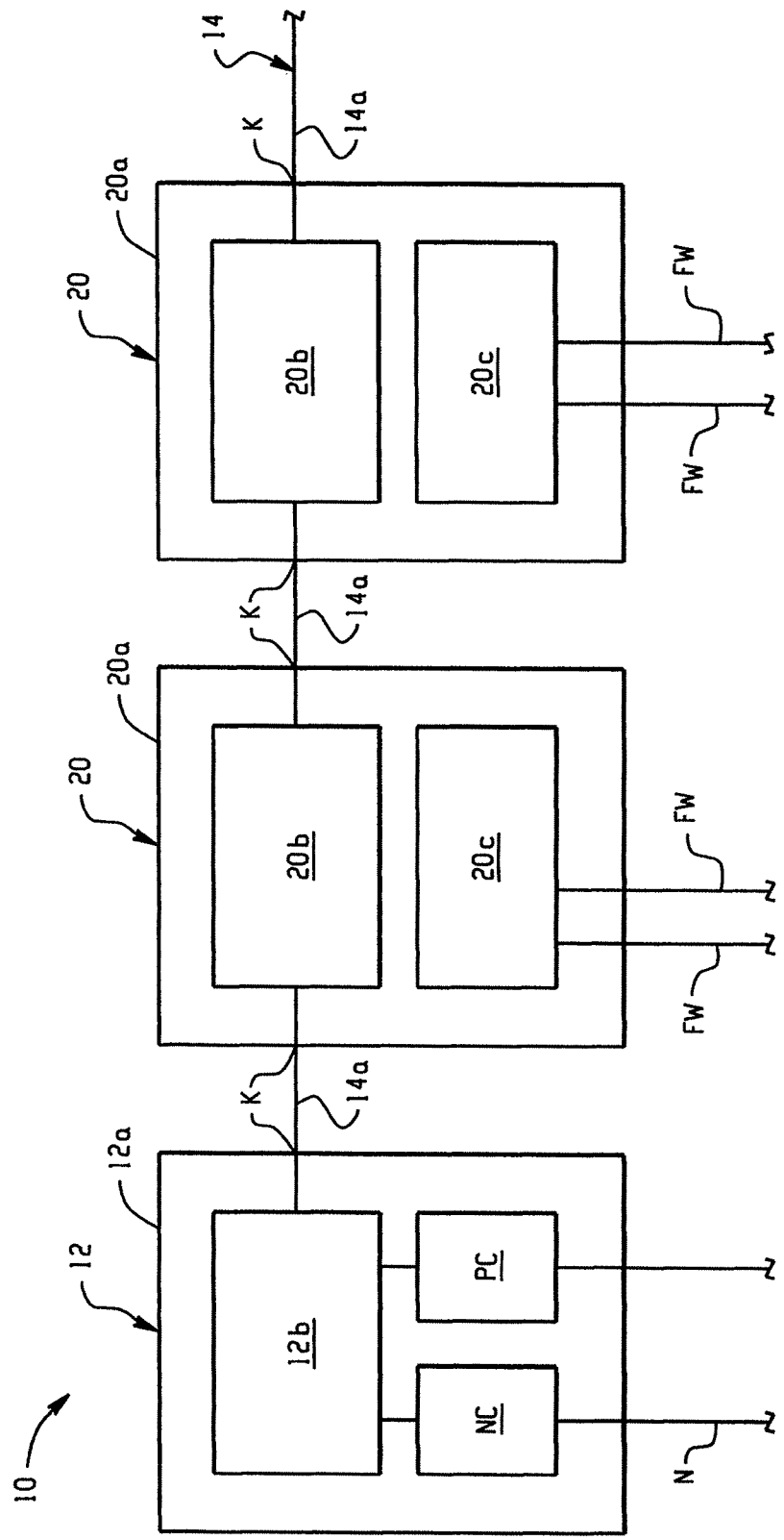
FIG. 2A provides a schematic representation of the known distributed modular input/output (I/O) system of FIG. 1.
Figure 2B:
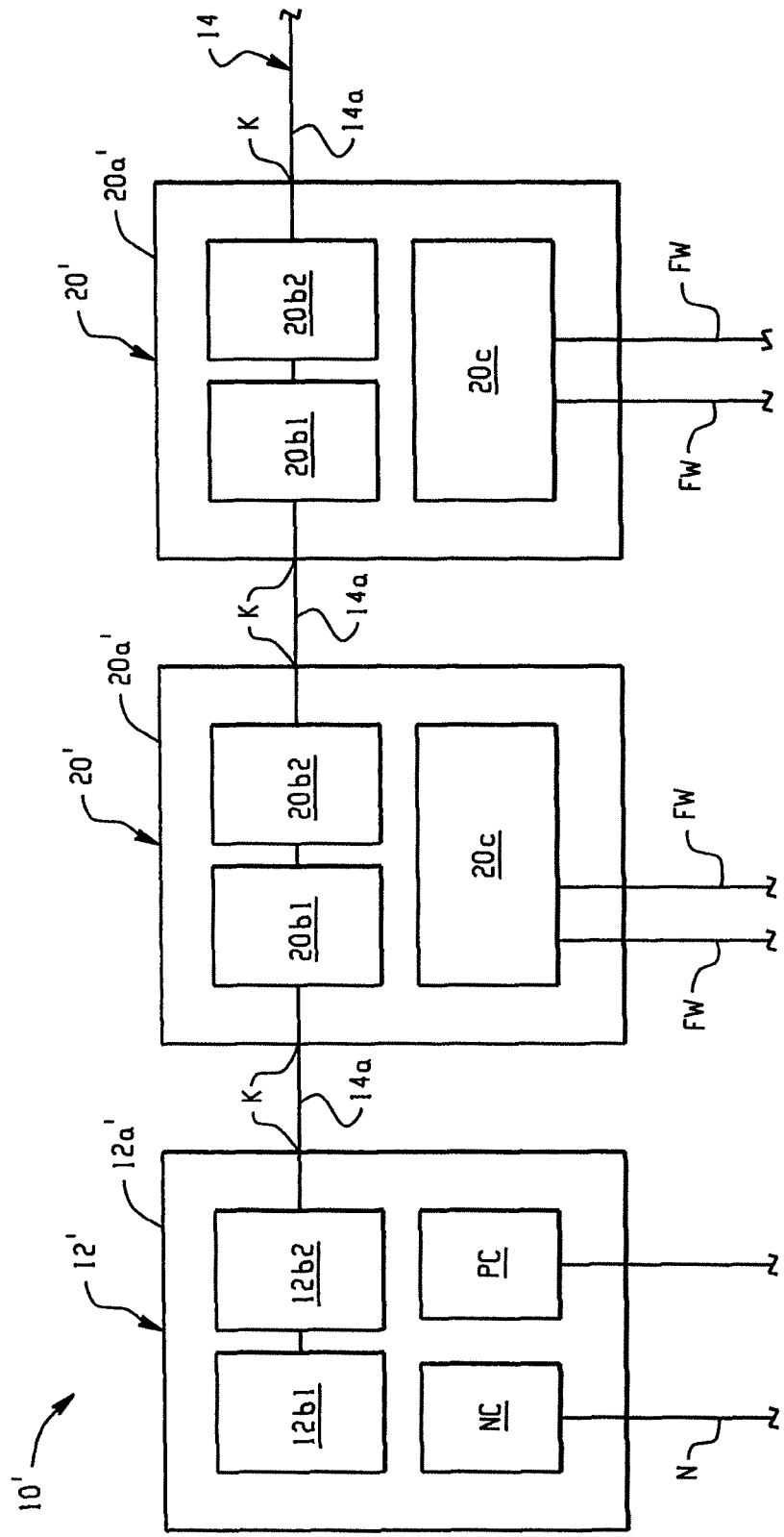
FIG. 2B is similar to FIG. 2A but shows a modified version of the distributed modular input/output (I/O) system of FIG. 1.
Figure 3:
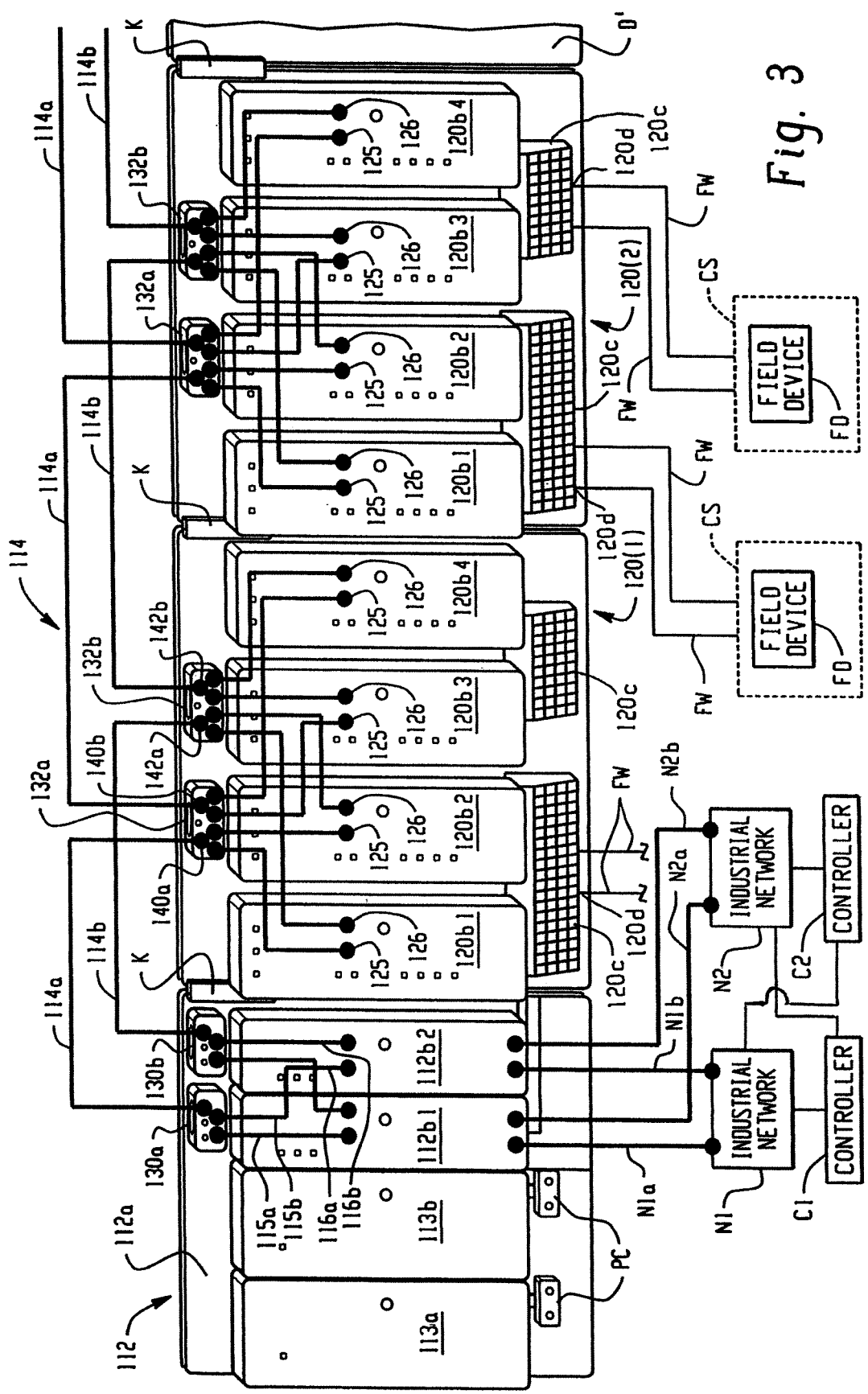
FIG. 3 illustrates a distributed modular input/output (I/O) system formed in accordance with an embodiment of the present development and illustrates an example of the redundant (dual) Ethernet backplane network thereof.

FIG. 3 shows a distributed modular I/O system 110 in accordance with an embodiment of the present development. As described in detail below, the system 110 comprises redundant backplane 114 for improved fault tolerance. In one example, the backplane 114 comprises first and second redundant ethernet networks 114a,114b implementing a suitable Ethernet data communications protocol such as a gigabit speed backplane protocol that can be a CIP-based protocol, but any other suitable network and/or communications protocol can be implemented without departing from the scope and intent of the present development.

The distributed modular I/O system 110 includes a network adapter 112 that is operatively connected to at least one industrial automation network N1,N2. As shown herein, the network adapter is connected to first and second redundant industrial automation networks N1,N2 such as first and second EtherNet/IP networks or other industrial automation networks so that the network adapter 112 receives data from, transmits data to, and otherwise communicates with one or more industrial control modules or "controllers" C1,C2 connected respectively to the networks N1,N2. The controllers C1,C2 comprises one or more programmable logic controllers (PLC), microprocessors, and/or other electronic processors for machine and/or process control.

The network adapter 112 includes an adapter base 112a that is mounted to a rail D' or other support structure. The network adapter 112 further comprises first and second identical or otherwise redundant adapter modules 112b1, 112b2 that are operating in parallel with each other and each of which is permanently or releasably connected to the adapter base 112a. Each adapter module 112b1,112b2 is operably connected to both the first and second networks N1,N2 through the adapter base 12a and includes the electronic circuitry for data communication data with the controllers C1,C2 via networks N1,N2 and for data communication with multiple I/O devices 120 of the system 110 as described below. The adapter 112 further comprises one or more network connectors NC connected to the adapter base 112a that are adapted for connecting the adapter modules 112b1,112b2 to the networks N1,N2 via known connectors such as RJ45 connectors, Small FormFactor Pluggable (SFP) connectors, optical fiber connectors, and/or the like.

The network adapter 112 further comprises first and second redundant power conditioning modules 116a,116b connected to the adapter base 112a and each including a power input connector PC for connecting with a source of electrical power for supplying system electrical power to the network adapter 112 and to the I/O devices 120 and other components operatively connected to the adapter 112 and/or I/O devices 120.

The I/O system 110 further comprises one or more I/O devices 120 that each include an I/O base 120a also mounted to the support rail D' or other support structure, with a first I/O base 120a located adjacent and operably physically and electrically connected to the adapter base 112a by a multi-contact electrical connector K and with the additional I/O bases 120a operably physically and electrically connected together one after the other in a sequential manner by successive mating multi-contact electrical connectors K such that a modular backplane circuit or backplane network (generally a "backplane" and schematically illustrated at 114) is constructed and adapted for communicating system electrical power and data through the successively connected I/O bases 120a and operably connects each I/O base 120a to the network adapter 112 and, thus, to the first and second industrial networks N1,N2 and the first and second controllers C1,C2. To facilitate an understanding of the present development, FIG. 3 schematically shows the backplane 114 as being external to the I/O device 110, but those of ordinary skill in the art will recognize that the backplane circuit or network 114 is physically constructed within and extends through the adapter bases 112a and the successively connected I/O bases 120a via mated connectors K. As shown, the system 110 includes first and second I/O devices 120(1) and 120(2).

With respect to the connectors K, the network adapter base 112a and the I/O base 120a of the first I/O device 120 include respective connectors K that operably mate with each other to physically connect the first and second backplane circuits/networks between the network adapter 112 and the first I/O device 120. Similarly, the first and second I/O devices 120(1) and 120(2) include respective connectors K that operably mate with each other to physically connect the first and second backplane circuits/networks between the first and second I/O devices 120(1),120(2).

In addition to the I/O base 120a, each I/O device 120 further comprises at least two I/O modules 120b (shown herein as I/O modules 120b1, 120b2,120b3,120b4) operatively removably connected to the I/O base 120a such that each of the installed I/O modules 120b also communicates with the network adapter 112 and the first and second controllers C1,C2 over the backplane 114 whereby input/output data are provided between the controllers C1,C2 and each I/O module 120b via backplane 114. Each installed I/O module 120b is selected and configured to perform one or more specialized input/output functions such as DC input, DC output, AC input, AC output, analog input and/or output, RTD and/or thermocouple input and/or output, or other analog or digital input/output.

Each I/O device includes at least two separate I/O modules 120 (120b1,120b2) each operatively removably connected to the I/O base 120a. In the illustrated embodiment, which is not intended to be limiting in any way, each I/O device 120 comprises four separate I/O modules 120b (120b1,120b2,120b3,120b4) each operatively removably connected to the I/O base 120a, and at least two of the I/O modules 120b are identical to each other and operated in parallel with each other to provide a redundancy with respect to each other (as shown, the I/O modules 120b3, 120b4 of the two illustrated I/O devices 120 are identical and operated redundantly in parallel with respect to each other).

Each I/O base 120a further includes at least one terminal block 120c comprising a plurality of cage clamps, spring clamps, screw terminals, or other wiring connectors 120d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the controlled system CS) by the controllers C1,C2. Each terminal block 120c can be a separate structure that is assembled to the I/O base 120a or can alternatively be defined as an integral or one-piece part of the I/O base 120a. Different varieties of terminal blocks 120a can be used depending upon the particular configuration required for the field device wiring connectors 120d, with some having different common terminals, ground connections, voltage supply terminals, and the like. Each installed I/O module 120b communicates with the field device wiring connectors 120d of the same I/O base 120a on which the I/O module 120b is physically installed. Input/output data are provided between the controllers C1,C2 and field device(s) FD connected to the corresponding I/O base 120a via backplane 114 and the network adapter modules 112b1,112b2. In the illustrated embodiment, the redundant, parallel I/O modules 120b3,120b4 share a common terminal block 120c such that the redundant I/O modules 120b3,120b4 are operably connected to the same field wiring FW to send data to and receive data from the controlled system CS.

The network adapter 112 includes first and second independent "adapter" Ethernet switches 130a,130b that each are operably connected to, form part of, and establish the backplane 114. Similarly, each I/O device 120 includes first and second independent "I/O module" Ethernet switches 132a,132b that each are operably connected to, form part of, and establish the backplane 114. The switches 130a,130b (generally 130) of the network adapter 112 and the switches 132a,132b (generally 132) of each I/O module 120 can be and are identical in the present embodiment but they are numbered differently herein to facilitate the description of their operation. In each case, the Ethernet switches 130,132 perform a packet switching operation that directs Ethernet network traffic from an input port of the switch to a particular output port of the same switch using the Media Access Control address(es) (MAC addresses) of the device(s) connected to the output port of the switch 130,132. As used herein, the term "Ethernet switch" is intended to encompass any multi-port Ethernet network device that maps/directs network data from a first (input) port on the switch device 130,132 to a second (output) port on the switch device 130,132 using information contained in the network data that describes the intended destination for the network data.

With respect to the network adapter 112, each Ethernet switch 130 is physically connected to the adapter base 112a, preferably by a releasable connection. Likewise, with respect to each I/O device 120, each Ethernet switch 132 is physically connected to the I/O base 120a, preferably by a releasable connection. For both the network adapter 112 and each I/O device 120, each Ethernet switch 130,132 is operably connected to the backplane 114 for communication of data on the backplane 114. The switches 130a,130b can be powered by a separate electrical power connection through the bases 112a,120a and/or using a Power over Ethernet (PoE) connection or other power delivery method through the backplane network 114, itself.

The switches 130 of the network adapter 112 each have at least three ports to implement a backplane 114 in accordance with the present development as described further below. Similarly, the switches 132 of each I/O module 120 have at least three ports to implement a backplane 114 in accordance with the present development as described further below. More particularly, the switches of the I/O devices 120 each have at least (2+n) ports, where "n" is the number of I/O modules 120b connected to the I/O base 120a.

In contrast to known systems, the present distributed I/O system 110 uses the first and second Ethernet switches 130a,130b of the network adapter 112 to establish and maintain first and second Ethernet backplane networks 114a, 114b that are completely redundant and independent with respect to each other.

As shown in FIG. 3, each adapter module 112b1,112b2 is operably connected to both of the first and second industrial control system networks N1,N2 via connections N1a,N1b and N2a,N2b. Furthermore, each Ethernet switch 130 of the adapter 112 is operably connected to both adapter modules 112b1,112b2. In particular, switches 130a,130b are connected to adapter module 112b1 by respective connections 115a,115b and switches 130a,130b are connected to adapter module 112b2 by respective connections 116a,116b. The switch 130a establishes the first backplane network 114a in operative communication with the first adapter module 112b1 on one of its ports, and the switch 130b establishes the second backplane network 114b in operative communication with the second adapter module 112b2 on one of its ports. As such, the first backplane network 114a is in operative communication with both the first and second adapter modules 112b1,112b2, and the second backplane network 114b is also independently in operative communication with both the first and second adapter modules 112b1,112b2.

Similarly, the first and second Ethernet switches 132a, 132b of each I/O device 120 are each connected to each I/O module 120b (120b1,120b2,120b3,120b4) by respective first connections 125 (for the first switch 132a) and respective second connections 126 (for the second switch 132b). The first switch 132a includes first (upstream) and second (downstream) "first backplane" propagation ports 140a, 140b that are respectively connected to upstream and downstream segments of the first backplane 114a (with "upstream" meaning logically closer to the corresponding/ first Ethernet switch 130a of the network adapter 112 as compared to "downstream"). In the same manner, the second switch 132b includes first (upstream) and second (downstream) "second backplane" propagation ports 142a,142b that are respectively connected to upstream and downstream segments of the second backplane 114b (again, with "upstream" meaning logically closer to the corresponding/ second Ethernet switch 130b of the network adapter 112 as compared to "downstream"). Because the first and second backplane circuits/backplane networks 114a,114b are physically constructed through the bases 112a,120a and connectors K, the first adapter Ethernet backplane switch 130a and the first I/O device Ethernet switches 132a of the successive I/O devices 120 are connected together in a serial or daisy-chain manner through the adapter 112 and the successively adjacent I/O devices 120 to form the first backplane 114a. Similarly, the second adapter Ethernet backplane switch 130b and the second I/O device switches 132a of the successive I/O devices 120 are connected together in a serial or daisy-chain manner through the adapter 112 and the successively adjacent I/O devices 120 to form the second backplane 114b.

Those of ordinary skill in the art will recognize that, since the first and second backplanes 114a,114b are independent and redundant, the distributed I/O device 110 will continue to operate even upon a failure of either the first backplane 114a or the second backplane 114b, since the other operating (non-failed) backplane 114a,114b provides a path for all backplane power and data. Furthermore, since the Ethernet backplane switches 130,132 are releasably connected to the bases 112a,120a, a failed switch 130,132 of one of the backplane networks 114a,114b can be unplugged and replaced while the distributed I/O device 110 is operative using the other backplane 114a,114b of which the replaced switch 130,132 is not a part. Other than the switches 130,132, the backplane circuitry of the adapter base 112a and each I/O base 120a is completely passive and provided by printed circuit board (PCB) or other passive electrical connection within the network adapter base 112a and each I/O base 120a which greatly improves fault tolerance because the probability of a failure of the passive components of the backplane network 114 is very low as compared to the active switches 130,132 which are replaceable during operation of the I/O device 110 as noted above.

Although the first and second backplane networks 114a, 114b are physically redundant with respect to each other, they need not carry identical data traffic and all times or at any time, although such use is also contemplated within the scope and intent of the present disclosure. In one embodiment, the first and second backplane networks carry certain data that is redundant with respect to each other, while other data is unique to each backplane network 114a,114b.

To facilitate an understanding of the following claims, it should be noted that:

the I/O device 120 immediately adjacent the network adapter 112 can be referred to as the "first I/O device" 120;

the I/O device 120 that is physically separated from the network adapter 112 by the first I/O device 120 can be referred to as the "second I/O device" 120;

the network adapter Ethernet data switches 130a,130b can be referred to as "first and second network data switches" 130a,130b;

the Ethernet data switches 132a,132b of the first I/O device 120 can be referred to as "third and fourth network data switches" 132a,132b; and, the Ethernet data switches 132a,132b of the second I/O device 120 can be referred to as the "fifth and sixth network data switches" 132a,132b.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. An industrial automation input/output (I/O) system comprising:

a redundant network adapter comprising an adapter base and first and second adapter modules each independently removable from the adapter base;

a redundant I/O module comprising an I/O base and first and second I/O devices each independently removable from the I/O base, wherein said I/O base is selectively removably connected to said adapter base;

a redundant data network including first and second independent backplane networks that each operably connect each of the first and second adapter modules of the redundant network adapter to both of the first and second I/O devices of the redundant I/O module, wherein said adapter base and said I/O base comprise respective electrical backplane connectors that are mated together when said I/O base is connected to said adapter base such that said mated electrical connectors form part of both said first and second independent backplane networks;

the redundant data network further comprising: (i) first and second Ethernet switches connected to and selectively removable from said adapter base; and (ii) third and fourth Ethernet switches connected to and selectively removable from said I/O base; wherein said first and third Ethernet switches are connected to said first backplane network and said second and fourth Ethernet switches are connected to said second backplane network such that each of the first and second backplane networks provides an independent data communications path between both of the first and second adapter modules of the redundant network adapter and each of the first and second I/O devices of the redundant I/O module.

2. A modular I/O system for an industrial automation network, said modular I/O system comprising:

a network adapter including first and second adapter modules each removably connected to an adapter base, wherein each adapter module is configured for operative connection with an associated industrial data network;

a first I/O device located adjacent to the network adapter and including first and second I/O modules each removably connected to a first I/O base and each configured for operative connection to an associated controlled system for input and output of redundant data with respect to the associated controlled system;

first and second independent backplane data networks that operably connect each of the first and second adapter modules to each of the first and second I/O modules;

a second I/O device including a second I/O base located adjacent the first I/O device, said first I/O base and said second I/O base comprising respective backplane connectors that are physically mated with each other and that define part of said first and second backplane networks when mated with each other, said second I/O device further comprising third and fourth I/O modules each removably connected to said second I/O base and each configured for operative connection to the associated controlled system for input and output of data with respect to the associated controlled system;

first and second network data switches removably connected to said network adapter, wherein said first network data switch is operably connected to said first backplane data network and said second network data switch is operably connected to said second backplane data network;

third and fourth network data switches removably connected to said first I/O base, wherein said third network data switch is operably connected to said first backplane data network and said fourth network data switch is operably connected to said second backplane data network;

fifth and sixth network data switches removably connected to the second I/O base, said fifth and sixth network data switches each operably connected to both of said third and fourth I/O modules for communication of data between each of said fifth and sixth network data switches and both of said third and fourth I/O modules.

3. The modular I/O system as set forth in claim 2, wherein said first and second network data switches are each operably connected to both of said first and second adapter modules of said network adapter for communication of data between each of said first and second network data switches and both of said first and second adapter modules.

4. The modular I/O system as set forth in claim 3, wherein said third and fourth network data switches are each operably connected to both said first and second I/O modules for communication of data between each of said third and fourth network data switches and said first and second I/O modules.

5. The modular I/O system as set forth in claim 4, wherein said first and third network data switches are operably connected to each other on said first backplane network for communication of data between said first and third network data switches on said first backplane network.

6. The modular I/O system as set forth in claim 5, wherein said second and fourth network data switches are operably connected to each other on said second backplane network for communication of data between said second and fourth network data switches on said second backplane network.

7. The modular I/O system as set forth in claim 6, wherein said third and fourth network data switches comprise respective downstream backplane ports that respectively operably connect said third and fourth network data switches to associated downstream network data switches respectively on said first and second backplane networks.

8. The modular I/O system as set forth in claim 2, wherein said downstream backplane port of said third network data switch is operably connected to said fifth network data switch on said first backplane network for communication of data between said third and fifth network data switches on said first backplane network.

9. The modular I/O system as set forth in claim 8, wherein said downstream backplane port of said fourth network data switch is operably connected to said sixth network data switch on said second backplane network for communication of data between said fourth and sixth network data switches on said second backplane network.

10. The modular I/O system as set forth in claim 9, wherein:
said first and second network data switches are adapted to be independently physically and operably disconnected from said adapter base;
said third and fourth network data switches are adapted to be independently physically and operably disconnected from said first I/O base; and
said fifth and sixth network data switches are adapted to be independently physically and operably disconnected from said second I/O base.

* * * * *